(12) United States Patent
Wang et al.

(10) Patent No.: US 7,285,842 B2
(45) Date of Patent: *Oct. 23, 2007

(54) SILOXANE EPOXY POLYMERS AS METAL DIFFUSION BARRIERS TO REDUCE ELECTROMIGRATION

(75) Inventors: Pei-I Wang, Troy, NY (US); Toh-Ming Lu, Loudonville, NY (US); Shyam P. Murarka, Clifton Park, NY (US); Ramkrishna Ghoshal, Clifton Park, NY (US)

(73) Assignees: Polyset Company, Inc., Mechanicville, NY (US); Rensselaer Polytechnic Institute, Troy, NY (US)

( * ) Notice: Subject to any disclaimer, the term of this patent is extended or adjusted under 35 U.S.C. 154(b) by 215 days.

This patent is subject to a terminal disclaimer.

(21) Appl. No.: 10/832,844

(22) Filed: Apr. 27, 2004

(65) Prior Publication Data

US 2005/0236711 A1  Oct. 27, 2005

(51) Int. Cl.
*H01L 23/58* (2006.01)
*H01L 23/485* (2006.01)
(52) U.S. Cl. ............... 257/642; 257/632; 257/741; 257/744; 257/E23.001; 257/E23.019
(58) Field of Classification Search ............... None
See application file for complete search history.

(56) References Cited

U.S. PATENT DOCUMENTS

| 6,096,648 | A | 8/2000 | Lopatin et al. ............ 438/687 |
| 6,387,824 | B1 * | 5/2002 | Aoi ............................ 438/778 |
| 6,528,412 | B1 | 3/2003 | Wang et al. ................. 438/628 |
| 2003/0042613 | A1 * | 3/2003 | Shioya et al. ............... 257/762 |
| 2004/0126482 | A1 * | 7/2004 | Wu et al. ..................... 427/58 |
| 2005/0239295 | A1 | 10/2005 | Wang et al. |

OTHER PUBLICATIONS

Wang, et al., "Novel Epoxy Siloxane Polymer as Low-K Dielectric", *Mat. Res. Soc. Symp. Proc.*, 812, F4.4.1-F4.4.6 (2004).

* cited by examiner

*Primary Examiner*—Sue A. Purvis
*Assistant Examiner*—Krista Z. Soderholm
(74) *Attorney, Agent, or Firm*—Heslin Rothenberg Farley & Mesiti P.C.

(57) ABSTRACT

Structures employing siloxane epoxy polymers as diffusion barriers adjacent conductive metal layers are disclosed. The siloxane epoxy polymers exhibit excellent adhesion to conductive metals, such as copper, and provide an increase in the electromigration lifetime of metal lines. In addition, the siloxane epoxy polymers have dielectric constants less then 3, and thus, provide improved performance over conventional diffusion barriers.

21 Claims, 4 Drawing Sheets

SILOXANE EPOXY POLYMERS AS METAL DIFFUSION BARRIERS TO REDUCE ELECTROMIGRATION

FIELD OF THE INVENTION

The present invention relates to semiconductor devices in which metallization/dielectric diffusion barrier materials are employed, and more particularly to the use of siloxane epoxy polymers as diffusion barrier caps in such devices.

BACKGROUND OF THE INVENTION

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by inter-wiring spacings. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region or a gate/metal region. Conductive lines are formed in trenches, which typically extend substantially horizontal with respect to the semiconductor substrate. Semiconductor chips comprising eight or more levels of metallization are becoming more prevalent as device geometries have shrunk to half-micron levels and to a tenth of a micron levels.

A conductive plug filling a via hole is typically formed by depositing an interlayer dielectric on a conductive layer comprising at least one conductive pattern. Generally, a dielectric barrier or capping layer (also referred to herein as a "diffusion barrier") is deposited onto the conductive layer prior to deposition of the dielectric. Next, an opening in the dielectric layer is formed by conventional photolithographic and etching techniques, and the opening is filled with a conductive metal, such as tungsten, aluminum, copper, or a copper alloy. Excess conductive material on the surface of the dielectric layer is typically removed by chemical mechanical polishing (CMP). After depositing a diffusion barrier on the metal and exposed surface of the dielectric layer, a second interlayer dielectric is typically deposited onto the barrier.

One such fabrication method is known as damascene and basically involves forming an opening in the interlayer dielectric and filling the opening with a conductive metal. Dual damascene techniques involve forming an opening comprising a lower contact or via hole section in communication with an upper trench section, which opening is filled with a conductive metal, to simultaneously form a conductive plug and electrical contact with a conductive line.

FIG. 1 is a cross-sectional view of a portion 10 of a prior art, conventional semiconductor metal interconnect structure fabricated using damascene processing, wherein trenches (lines) (not shown) and a via (hole) 20 are etched into interlayer dielectric 30, which is disposed atop a semiconductor substrate 15. Conductive metal 50 is deposited into via 20 and planarized. In this embodiment, Ta-based liner 40, made of tantalum, TaN, or TaSiN, is conformally deposited onto sidewalls 21a and 21b and bottom 22 of via 20 (and any trenches, not shown), prior to deposition of metal 50 and planarization. Dielectric barrier 60, traditionally made of SiN, SiC, SiCH, or SiCN, atop metal 50 acts as a diffusion barrier, as well as an etch stop layer. A second dielectric or metal 70 is then deposited atop dielectric barrier 60.

Disadvantageously, however, the atomic transport at the metal/diffusion barrier interface 61 is the most important contributor to electromigration of the metal. Since conductive metals, such as Cu, do not adhere well to the traditional dielectric barrier materials, the interface provides the fastest interfacial diffusion path. Prior solutions to reducing electromigration include using a metallic-based cap (Ta, Pd, or CoWP) for the metal lines, but the increase in the fabrication complexity and in the effective resistivity are undesirable.

Thus, it is known that a diffusion barrier or capping material is needed between the metal and dielectric to reduce the amount of metal diffusion into the neighboring dielectric material. However, because interfacial diffusion at the metal/diffusion barrier interface is the major contributor to reduction in the life-time associated with the electromigration failure in integrated circuits (IC), it is desirable to improve the interfacial bonding at such interfaces to reduce and eliminate the interfacial diffusion. The use of traditional diffusion barriers such as SiN, SiC, SiCH, and SiCN only provide marginal success.

Furthermore, the aforementioned traditional diffusion barriers have dielectric constants larger than 6. It is known, however, that lowering the overall dielectric constants (κ values) of the dielectric layers employed in metal interconnects lowers the resistance capacitance (RC) product of the chip and improves its performance. The high κ values of traditional diffusion barriers increase the overall κ value of the structure and are therefore not acceptable for future high speed ICs.

Thus, a need exists in the semiconductor industry for a diffusion barrier material having improved adhesion to the conductive metal, thereby reducing interfacial metal diffusion. It would also be particularly advantageous if such a material could have a dielectric constant of 3.9 or lower, thereby reducing the overall κ value of the final structure.

SUMMARY OF THE INVENTION

The present invention meets the aforementioned needs and provides semiconductor structures which include a diffusion barrier material having unexpectedly improved adhesion to conductive metals. In particular, the present invention reduces electromigration in semiconductor devices through the utilization of siloxane epoxy polymers as diffusion barriers or capping materials. Furthermore, the siloxane epoxy polymers discussed herein have dielectric constants less then 3, and can therefore provide much better performance than the conventional diffusion barriers. Advantageously, the same low κ dielectric material could then also be used as the interlayer dielectric between metallization layers.

Therefore, the present invention relates to a structure comprising a conductive layer and a diffusion barrier disposed onto a surface of the conductive layer. The conductive layer comprises a conductive metal, and the diffusion barrier comprises a first layer and a second layer. The first layer is adjacent to both the second layer and to the surface of the conductive layer. Furthermore, the first layer and the second layer are each independently selected from the group of siloxane epoxy polymers.

DETAILED DESCRIPTION OF THE INVENTION

The present invention employs siloxane epoxy polymers in place of conventional dielectrics or metal-based caps currently being employed as diffusion barriers for metal interconnects in semiconductor structures. The polymers described herein exhibit excellent adhesion to metals, such as copper, and provide an increase in the electromigration lifetime of metal lines.

Figure 1:
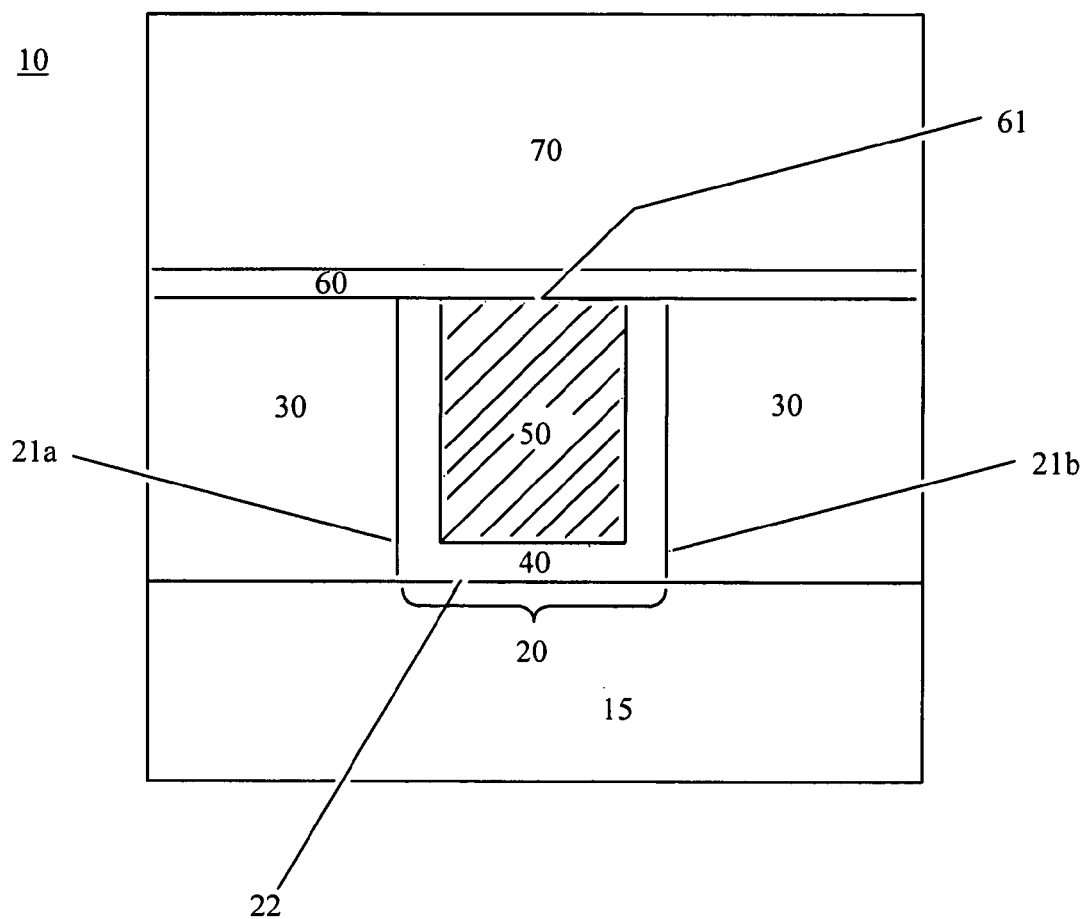
FIG. 1 is a cross-section of a prior art metal interconnect portion of a semiconductor structure utilizing a traditional diffusion barrier.
Figure 2:
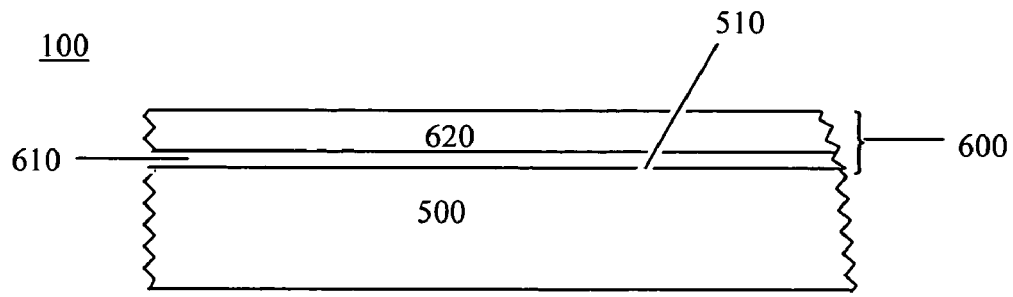
FIG. 2 is a cross-section of a structure illustrating an embodiment of the diffusion barrier of the present invention disposed onto a surface of a conductive layer.
Figure 3:
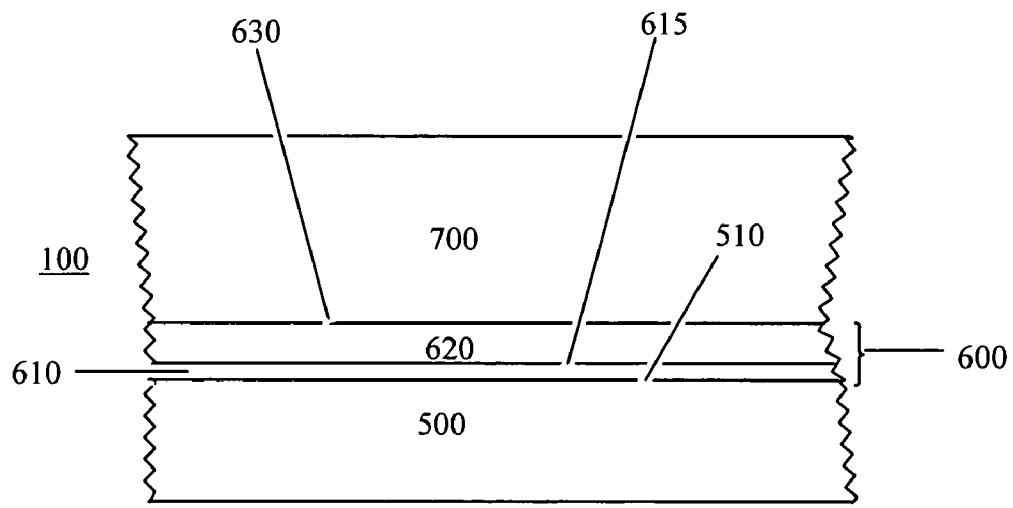
FIG. 3 is a cross-section of the structure of FIG. 2 showing an optional dielectric material disposed on the diffusion barrier of the present invention.

FIGS. 2-3 each depict a structure 100 in which the diffusion barrier system of the present invention has been incorporated. In each of FIGS. 2-3, conductive layer 500 has been provided with an adjacent metal diffusion barrier 600 disposed thereon. FIG. 3 includes optional dielectric layer 700 disposed onto diffusion barrier 600. Typically, the structures of FIGS. 2 and 3 would be disposed onto a dielectric material (not shown) disposed onto a semiconductor substrate (not shown) and used in semiconductor devices, which employ conventional damascene processing, as previously described, one of which is depicted in FIG. 1. In addition, it should be noted that the invention also includes semiconductor structures in which the materials depicted in FIGS. 2-3 are deposited over a substrate (not shown) in reverse order.

As used herein, the term "semiconductor substrate" refers to substrates known to be useful in semiconductor devices, i.e. intended for use in the manufacture of semiconductor components, including, but not limited to, focal plane arrays, opto-electronic devices, photovoltaic cells, optical devices, transistor-like devices, 3-D devices, silicon-on-insulator devices, super lattice devices and the like. Semiconductor substrates include integrated circuits preferably in the wafer stage having one or more layers of wiring, as well as integrated circuits before the application of any metal wiring. Furthermore, a semiconductor substrate can be as simple as the basic wafer used to prepare semiconductor devices. The most common such substrates used at this time are silicon and gallium arsenide.

FIG. 2 is a cross-sectional view of structure 100 illustrating an embodiment of the present invention. In FIG. 2, conductive layer 500 made of a conductive metal has been formed. The conductive metal is typically aluminum, an aluminum alloy, tungsten, cobalt, a metal silicide, copper, or a copper alloy. However, the conductive metal is preferably copper or a copper alloy because copper has a lower resistivity than aluminum and improved electrical properties compared to tungsten. Thus, copper is a very desirable metal for use as a conductive plug as well as conductive wiring.

Diffusion barrier 600 is disposed onto surface 510 of conductive layer 500. One primary purpose of barrier 600 is to serve as a diffusion barrier to prevent diffusion of copper or other conductive metal from conductive layer 500 into the surrounding dielectric material (shown in FIG. 3). Diffusion barrier 600 also protects conductive layer 500 during subsequent etching of an overlying dielectric layer.

Diffusion barrier 600 comprises two adjacent layers 610 and 620, wherein each layer independently comprises a siloxane epoxy polymer, as described herein. First layer 610 acts as an adhesion promoter, and second layer 620 prevents metal diffusion. Adhesion promoter layer 610 is adjacent surface 510 of conductive metal layer 500.

Formation of diffusion barrier 600 is done by first depositing adhesion promoter layer 610 comprising a siloxane epoxy polymer described herein onto surface 510 of conductive layer 500 to a thickness ranging from about 0.001 μm to about 3 μm, but preferably ranging from about 0.01 μm to about 0.03 μm, by any known method, such as spin casting (also referred to herein as "spin coating"), dip coating, roller coating, or doctor blading, for example. Typically, spin casting is used.

After deposition, the siloxane epoxy polymer adhesion promoter layer 610 and adjacent metal layer 500 are typically dried to remove solvent from the polymer solution, followed by curing and annealing, as described herein. Good adhesion of the polymer to the metal is assured because of the polymer/metal interaction at interface 510.

Next, adjacent siloxane epoxy polymer barrier layer 620 is deposited onto dried/cured adhesion promoter layer 610 to a thickness ranging from about 0.02 μm to about 10 μm, but preferably ranging from about 0.02 μm to about 0.05 μm by any of the aforementioned methods. Again, spin-casting is typically employed. Drying and curing steps, followed by annealing, as described herein, are then performed to cross-link polymer 620.

However, prior to deposition of siloxane epoxy polymer barrier layer 620 onto adhesion promoter layer 610, surface 615 of adhesion promoter layer 610 typically undergoes a surface treatment to promote wetting and adhesion of subsequently deposited polymer 620. An exemplary surface treatment is described in the aforementioned related U.S. patent application being filed concurrently herewith under Ser. No. 10/832,629 and entitled "CHEMICAL TREATMENT OF MATERIAL SURFACES". Briefly, the treatment involves contacting the cured polymer surface 615 with an aqueous solution of sulfuric acid or phosphoric acid and rinsing it off with water, followed by drying.

The siloxane epoxy polymers described herein are unlike many other polymers, which do not adhere well to metals and which allow diffusion of metallic ions/atoms at high process/use temperatures and electric fields, invariably both imposed at the same time. Furthermore, the siloxane epoxy polymers used in the present structures allow excellent adhesion to metals, while at the same time metal diffusion into the polymer matrix is inhibited. Thus, the siloxane epoxy polymers are very suitable for use in diffusion barriers and adhesion promoter applications.

Exemplary preferred siloxane epoxy polymers suitable for use as adhesion promoter layer 610 and/or diffusion layer 620 include those commercially available from Polyset Company as PC 2000, PC 2003, PC 2000HV, each of which has the following structure (I).

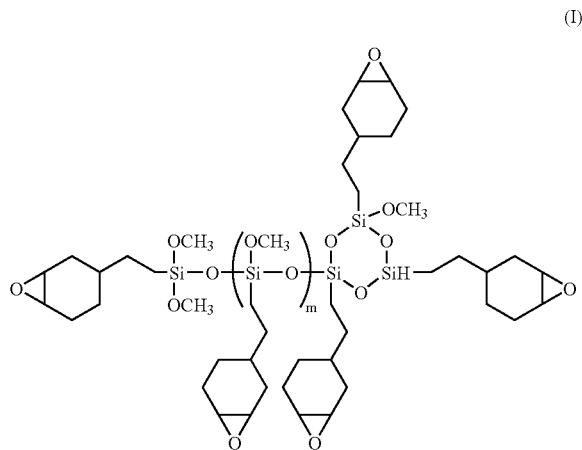

(I)

wherein m is an integer from 5 to 50. The molecular weights of these polymers range from about 1000 to about 10,000 g/mole.

Other suitable siloxane epoxy polymers for use as layer 610 and/or 620 of diffusion barrier 600 include random and block copolymers having the following general following formula (II):

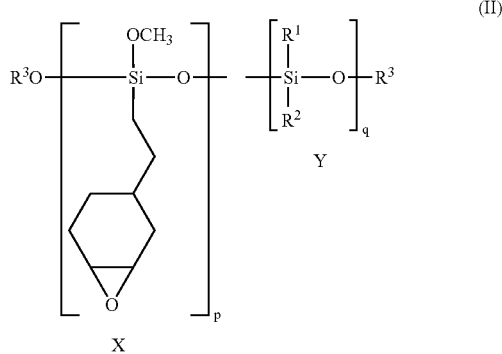

(II)

wherein the X monomer units and Y monomer units may be randomly distributed in the polymer chain. Alternatively, like repeating units, X and Y, respectively, may occur together in a block structure. The polymers of structure (II) are advantageous because they have unexpectedly low dielectric constants of less than 3. Therefore, they are useful as diffusion barriers, as well as low k interlayer dielectric materials, as described in the aforementioned related U.S. application entitled "SILOXANE EPOXY POLYMERS FOR LOW-κ DIELECTRIC APPLICATIONS" being filed concurrently herewith under Ser. No. 10/832,515.

Preferably, in formula (II), $R^1$ and $R^2$ are each independently methyl, methoxy, ethyl, ethoxy, propyl, butyl, pentyl, octyl, and phenyl, and $R^3$ is methyl or ethyl. In addition, p is an integer ranging from 2 to 50; and q is 0 or an integer ranging from 1 to 50. Most preferably, $R^3$ in the terminal residues at the end of the polymer chain is methyl, resulting in a polymer having structure (IIA).

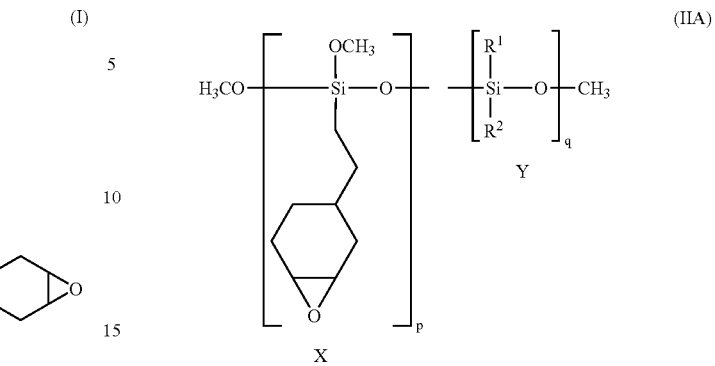

(IIA)

Exemplary polymers having structure (IIA) include, but are not limited to, Polyset's PC 2010, PC 2021, and PC 2026. In PC 2010, $R^1$ and $R^2$ in structure (IIA) are both phenyl groups, and the ratio of p to q ranges from about 8:1 to about 1:1, but is usually about 4:1 to about 2:1. The molecular weight of PC 2010 ranges from about 5000 to about 7500 g/mole. In PC 2021, $R^1$ and $R^2$ are both methyl groups, as shown in structure (IIB), and the ratio of p to q ranges from about 8:1 to about 1:1, but is usually about 4:1 to about 2:1. The molecular weight of PC 2021 ranges from about 2000 to about 7500 g/mole. In PC 2026, $R^1$ is trifluoropropyl, and $R^2$ is a methyl group. The ratio of p:q is typically about 3:1. The molecular weight of PC 2026 ranges from about 5000 to about 7500 g/mole.

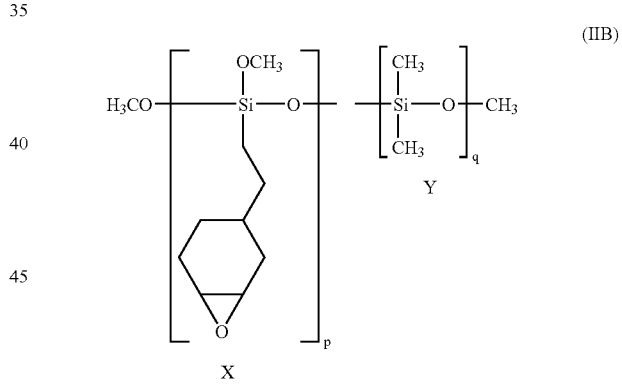

(IIB)

Siloxane epoxy polymers of structure (II) containing monomer units X and Y may be synthesized by base-catalyzed hydrolysis and subsequent condensation of alkoxy silane monomers, using 0.5 to 2.5 equivalents of water in the presence of an ion exchange resin, such as Amberlyst A-26, Amberlite IRA-400 and Amberlite IRA-904 from Rohm & Haas, in the presence of an alcohol solvent, followed by separation of the siloxane oligomer from the water/solvent mixture. The procedure for the polymerization is described fully in U.S. Pat. Nos. 6,069,259 and 6,391,999 and copending, commonly assigned U.S. application Ser. No. 10/269,246 filed Oct. 11, 2002.

In structure (II), the alkoxy silane monomer from which the X units are derived may be 2-(3,4-epoxycyclohexyl-ethyl)trimethoxy silane, which is commercially available as A-186 from Witco Corporation. Exemplary monomers used to provide the Y units include tetraethoxysilane (ethylorthosilicate), tetramethoxysilane (methylorthosilicate), tetraisopropoxysilane, methyltrimethoxysilane, ethyltriethoxysilane, hexyltriethoxysilane, cyclohexyltrimethoxysilane, 1,1,1-trifluoroethyltriethoxysilane, phenyltriethoxysilane, phenylmethyldiethoxysilane, phenylmethyldimethoxysilane, diphenyldimethoxysilane (used in PC 2010), 2-phenylethyltrimethoxysilane, benzyltriethoxysilane, vinyltrimethoxysilane, dimethyldimethoxysilane (used in PC 2021), methylpropyldimethoxysilane, dipropyldimethoxysilane, dibutyldimethoxysilane, methylpentyldimethoxysilane, dipentyldimethoxysilane, dioctyldimethoxysilane, dimethyldiethoxysilane, trimethylmethoxysilane, diethyldimethoxysilane, allyltrimethoxysilane, divinyldimethoxysilane, methyvinyldimethoxysilane, bis(triethoxysilyl)methane, bis(triethoxysilyl)ethane, butenyltrimethoxysilane, trifluoropropylmethyldimethoxysilane (used in PC 2026), 3-bromopropyltrimethoxysilane, 2-chloroethylmethyldimethoxysilane, 1,1,2,2-tetramethoxy-1,3-dimethyldisiloxane, phenyltrimethoxysilane. Also, useful in these mixtures are trimethoxysilyl-terminated polydimethylsiloxanes as well as the corresponding hydroxyl-terminated polydimethylsiloxanes. The foregoing monomers are either commercially available or readily synthesized by reactions well known in the art.

One preferred material for use as layer 610 and/or 620 of diffusion barrier 600 is the siloxane epoxy polymer having structure (IIB) above (PC 2021), which may be synthesized from 2-(3,4-epoxycyclohexylethyl)trimethoxy silane (A-186) (to form the X units), and dimethyldimethoxysilane (to form the Y units). Dimethyldimethoxysilane is commercially available United Chemical Technology or readily synthesized by reactions well known in the art. As previously mentioned, the ratio of p to q ranges from about 8:1 to about 1:1, but is usually about 4:1 to about 2:1. The polymer of structure (IIB) has a surprisingly low dielectric constant ranging from about 2.2 to about 2.7.

As previously mentioned, after deposition, each siloxane epoxy polymer layer may be cured by art-recognized techniques, such as thermally or by using actinic radiation, such as U.V. or electron beam. However, prior to curing, the polymers may be dried under vacuum to remove solvent for a time ranging from about 0.5 to about 2 hours, and a temperature ranging from about 80° C. to about 120° C., but typically about 1 hour at about 100° C.

Curing of the polymer is effected in the presence of a cationic polymerization initiator such as a diazonium, sulfonium, phosphonium, or iodonium salt, but more preferably a diaryliodonium, dialkylphenacylsulfonium, triarylsulfonium, or ferrocenium salt photo initiator.

A preferred polymerization cationic initiator is a diaryliodonium salt selected from the group having formulae (III), (IV), (V), (VI), and (VII)

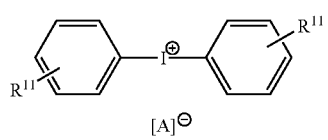
(III)

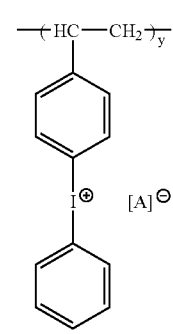
(IV)

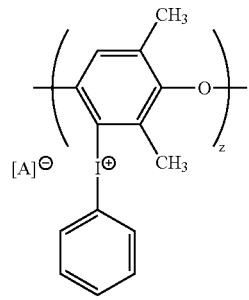
(V)

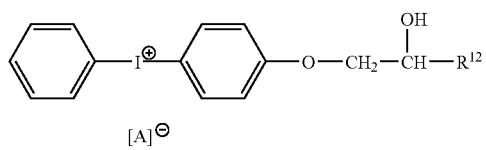
(VI)

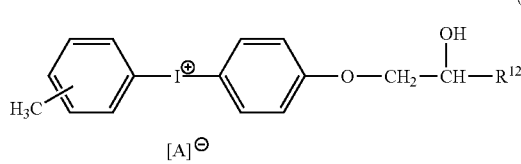
(VII)

wherein each $R^{11}$ is independently hydrogen, $C_1$ to $C_{20}$ alkyl, $C_1$ to $C_{20}$ alkoxyl, $C_1$ to $C_{20}$ hydroxyalkoxyl, halogen, and nitro; $R^{12}$ is $C_1$ to $C_{30}$ alkyl or $C_1$ to $C_{30}$ cycloalkyl; y and z are each independently integers having a value of at least 5; $[A]^-$ is a non-nucleophilic anion, commonly $[BF_4]^-$, $[PF_6]^-$, $[AsF_6]^-$, $[SbF_6]^-$, $[B(C_6F_5)_4]^-$, or $[Ga(C_6F_5)_4]^-$. These diaryliodonium salt curing agents are described in U.S. Pat. Nos. 4,842,800; 5,015,675; 5,095,053; 5,073,643; and 6,632,960.

Preferably, the cationic polymerization initiator is dissolved in 3,4-epoxycyclohexylmethyl-3',4'-epoxycyclohexane carboxylate, dicyclopentadiene dioxide, or bis(3,4-epoxycyclohexyl) adipate to form a catalyst solution which contains from about 20 to about 60 parts by weight of the selected cationic initiator and from about 40 to about 80 parts by weight of 3,4-epoxycyclohexylmethyl-3',4'-epoxycyclohexane carboxylate, dicyclopentadiene dioxide, or bis(3,4-epoxycyclohexyl) adipate. When the cationic polymerization initiator is a diaryliodonium salt, the catalyst solution preferably contains about 40 parts by weight of the diaryliodonium salt curing agent and about 60 parts by weight 3,4-epoxycyclohexylmethyl-3',4'-epoxycyclohexane carboxylate, dicyclopentadiene dioxide, or bis(3,4-epoxycyclohexyl) adipate.

Typically, from about 0.1 to about 5 parts by weight of the catalyst solution is added to an appropriate amount of siloxane epoxy polymer resin (ranging from about 95 to about 99.9 parts by weight siloxane epoxy polymer).

Preferred diaryliodonium salts include [4-(2-hydroxy-1-tetradecyloxy)-phenyl]phenyliodonium hexafluoroantimonate having formula (VI), wherein [A]⁻ is [SbF$_6$]⁻, and R$^{12}$ is C$_{12}$H$_{25}$ (available from Polyset Company, as PC-2506); [4-(2-hydroxy-1-tetradecyloxy)-phenyl]phenyliodonium hexafluorophosphate, wherein in formula (VI), [A]⁻ is [PF$_6$]⁻, and R$^{12}$ is C$_{12}$H$_2$ (available from Polyset Company as PC-2508); [4-(2-hydroxy-1-tetradecyloxy)-phenyl]4-methylphenyliodonium hexafluoroantimonate (formula (VII)), wherein [A]⁻ is [SbF$_6$]⁻, and R$^{12}$ is C$_{12}$H$_{25}$ (available from Polyset Company as PC-2509), and [4-(2-hydroxy-1-tetradecyloxy)-phenyl] 4-methylphenyliodonium hexafluorophosphate (formula (VII)), wherein [A]⁻ is [PF$_6$]⁻, and R$^{12}$ is C$_{12}$H$_{25}$ (available from Polyset Company as PC-2519). The preparation of cationic initiators having formula (VII) is discussed in the aforementioned U.S. Pat. No. 6,632,960.

Depending on the thickness of the film, thermal curing is generally performed by heating the deposited polymer solution to a temperature ranging from about 155° C. to about 360° C., but preferably about 165° C., for a period of time ranging from about 0.5 to about 2 hours. In formulations curable by U.V. light, the films may be flood exposed by U.V. light (>300 mJ/cm$^2$ @ 250-380 nm). Curing by E-beam radiation is often done at a dosage ranging from about 3 to about 12 Mrad. E-beam curing is described in U.S. Pat. Nos. 5,260,349 and 4,654,379. The particular polymer formulation will determine which curing method will be used, as one of skill would know. Following curing, a thermal anneal will often be employed under nitrogen or other inert gas at temperatures ranging from about 200° C. to about 300° C., but preferably about 250° C. for a period of time ranging from about 1 to about 3 hours, but preferably about 2 hours. However, it should be noted that when the conductive layer is deposited onto the adhesion promoter layer, a final thermal anneal, and even drying and curing are generally not performed on the adhesion promoter layer in order to permit the polymer surface to remain activated for reaction with the metal. The reaction between the adhesion promoter layer and the conductive layer is thus promoted by drying, curing, and annealing the entire structure.

Furthermore, by changing the formula of the polymer, by varying its concentration, and the thickness of the deposited film, the onset curing temperature and the speed of cure can be adjusted within a wide latitude.

Typically, when the siloxane epoxy films are thermally cured, the amount of catalyst can be decreased dramatically relative to the amount of photocatalyst needed to effect a cure induced by actinic radiation. For instance, in a thermal treatment, an exemplary siloxane resin composition contains about 0.1 wt. % catalyst (i.e. 0.1 parts by weight catalyst solution and about 99.9 parts by weight siloxane polymer, wherein an exemplary catalyst solution is a 40 wt. % solution of [4-(2-hydroxy-1-tetradecyloxy)-phenyl]phenyliodonium hexafluoroantimonate (Polyset PC-2506) dissolved in 3,4-epoxycyclohexylmethyl 3',4'-epoxycyclohexanecarboxylate (Union Carbide ERL-4221E)). By contrast, when the curing process is done by photo-irradiation, the amount of the catalyst is generally about 4 wt. % (i.e. 4 parts by weight catalyst solution and 96 parts polymer).

FIG. 3 shows an embodiment wherein optional dielectric material 700 has been disposed, typically as an interlayer dielectric between metallization layers, onto exposed surface 630 of diffusion barrier 600 to a thickness ranging from about 0.02 μm to about 2 μm, but preferably ranging from about 0.1 μm to about 0.7 μm. However, prior to deposition of dielectric material 700 onto diffusion barrier 600, exposed surface 630 typically undergoes a surface treatment to promote wetting and adhesion of subsequently deposited dielectric 700, as previously described. Exemplary dielectric materials include, but are not limited to, polyimides, parylene (poly-p-xylylene), polynaphthalene, benzocyclobutane (BCB), silicon-containing organic polymers, such as methyl silsesquioxane (MSQ), and hydrogen silsesquioxane (HSQ), and aromatic hydrocarbon polymers, such as SiLK™, which contains phenylene and carbonyl groups in the main chain, Nautilus™, and FLARE™, which is a poly(arylene) ether. SiLK™ and Nautilus™ are available from Dow Chemical Company. FLARE™ is manufactured by Allied Signal. Other dielectric materials include the siloxane epoxy polymers described herein. As previously noted, siloxane epoxy polymer having formula (IIB) has a dielectric constant ranging from about 2.2-2.7, and is therefore a preferred low k dielectric material for use as an interlayer dielectric between metallization layers.

Furthermore, it should be noted that a typical integrated circuit structure may have eight or more interconnect (metal) layers stacked on top of each other. Interposed between each metal layer is a dielectric layer. Accordingly, the present invention also embraces these multilevel structures wherein a metal diffusion barrier comprising adjacent siloxane epoxy polymer layers separates a metal interconnect layer from a corresponding dielectric layer.

The following examples are given by way of illustration and are not intended to be limitative of the present invention. The reagents and other materials used in the examples are readily available materials, which can be conveniently prepared in accordance with conventional preparatory procedures or obtained from commercial sources.

EXAMPLE 1

N-type, 4-inch silicon wafers having a resistivity of 0-0.02 ohm-cm for MIM (metal-insulator-metal) structures were used as the substrates. After standard RCA cleaning an adhesion layer (HMDS) was spin-coated onto each wafer at 3000 rpm for 40 sec. The wafers were then annealed in air at 100° C. for 10 min. A siloxane epoxy polymer solution containing formula (IIB), wherein the ratio of p to q was about 2:1, was spin-coated onto each wafer at 3000 rpm for 100 sec to a thickness of 0.5 μm. Onto the deposited polymer films, copper metal thin films were deposited to a thickness of 0.3 μm using sputtering or e-beam evaporation. The Cu/polymeric film/wafers were then dried under vacuum of 10$^{-3}$ torr for 1 hour at 100° C. The samples were then cured at 165° C. for 2 hours to cross-link the polymer, followed by a thermal anneal at 250° C. under nitrogen gas flow for 1 hour. These films passed the industry-accepted Scotch® tape adhesion test, which was executed using commercially available Scotch® tape attached to the film surface, followed by pulling the tape at a 90° angle to the sample.

EXAMPLE 2

The procedure of Example 1 was followed. Then a thin layer of an adhesion promoter was deposited onto the copper surface of each sample. The adhesion promoter was also a siloxane epoxy polymer solution having formula (IIB), wherein the ratio of p to q was about 2:1, and was spin-coated onto the copper films at 3000 rpm for 100 sec to a thickness ranging from about 0.01 μm to about 0.03 μm. The samples were then dried under vacuum of 10$^{-3}$ torr for 1 hour at 100° C., followed by curing at 165° C. for 2 hours and a thermal anneal at 250° C. under nitrogen gas flow for 1 hour to cross-link the polymer. The surface of the polymeric adhesion promoter layer was then contacted with an aqueous solution of sulfuric acid (50% by weight) for 30 seconds at room temperature, followed by removal of the acid solution by rinsing with deionized water for 30 seconds at room temperature and drying. A second layer comprising a siloxane epoxy polymer solution containing formula (IIB), wherein the ratio of p to q was about 2:1, was spin-coated onto the fully annealed and acid-treated adhesion promoter at 3000 rpm for 100 sec to a thickness ranging from about 0.02 µm to about 0.05 µm. The whole stacks (wafer/polymeric film/Cu/adhesion promoter/diffusion barrier) were dried under vacuum of $10^{-3}$ torr for 1 hour at 100° C., followed by curing at 165° C. for 2 hours and a thermal anneal at 250° C. under nitrogen gas flow for 1 hour to cross-link the polymer. These samples also passed the aforementioned Scotch® tape tests.

EXAMPLE 3

N-type, 4-inch silicon wafers having a resistivity of 0-0.02 ohm-cm for MIM (metal-insulator-metal) structures were used as the substrates. After standard RCA cleaning, an adhesion layer (HMDS) was spin-coated onto each wafer at 3000 rpm for 40 sec. The wafers were then annealed in air at 100° C. for 10 min. A siloxane epoxy polymer solution, acting as a diffusion barrier and containing formula (IIB), wherein the ratio of p to q was about 2:1, was spin-coated onto each wafer at 3000 rpm for 100 sec to a thickness ranging from about 0.02 µm to about 0.05 µm. The polymeric film/wafers were dried under vacuum of $10^{-3}$ torr for 1 hour at 100° C. The polymer films were then cured at 165° C. for 2 hours to cross-link the polymer, followed by a thermal anneal at 250° C. under nitrogen gas flow for 1 hour. The surface of the polymeric diffusion barrier was then contacted with an aqueous solution of sulfuric acid (50% by weight) for 30 seconds at room temperature, followed by removal of the acid solution by rinsing with deionized water for 30 seconds at room temperature and drying. A thin layer of an adhesion promoter comprising the siloxane epoxy polymer having formula (IIB), wherein the ratio of p to q is about 2:1, was spin-coated onto the treated polymeric films at 3000 rpm for 100 sec. to a thickness ranging from about 0.01 µm to about 0.03 µm to complete the diffusion barrier. The adhesion promoter was cured at 165° C. for 2 hours under nitrogen gas flow but was not annealed so that the polymer surface remained activated for the reaction with copper. Onto the siloxane adhesion promoter, copper metal thin films were deposited to a thickness of 0.3 µm using sputtering or e-beam evaporation. The samples were then subjected to Bias Temperature Stressing (BTS) conditions of 0.5 MV/cm and 150° C. for 1 hr.

EXAMPLE 4

The procedure of Example 3 was followed except that after deposition of the copper layer onto the adhesion promoter, the whole structure was thermally annealed under nitrogen at 250° C. for 1 hr. The samples were then subjected to Bias Temperature Stressing (BTS) conditions of 0.5 MV/cm and 150° C. for 1 hr.

Figure 4:
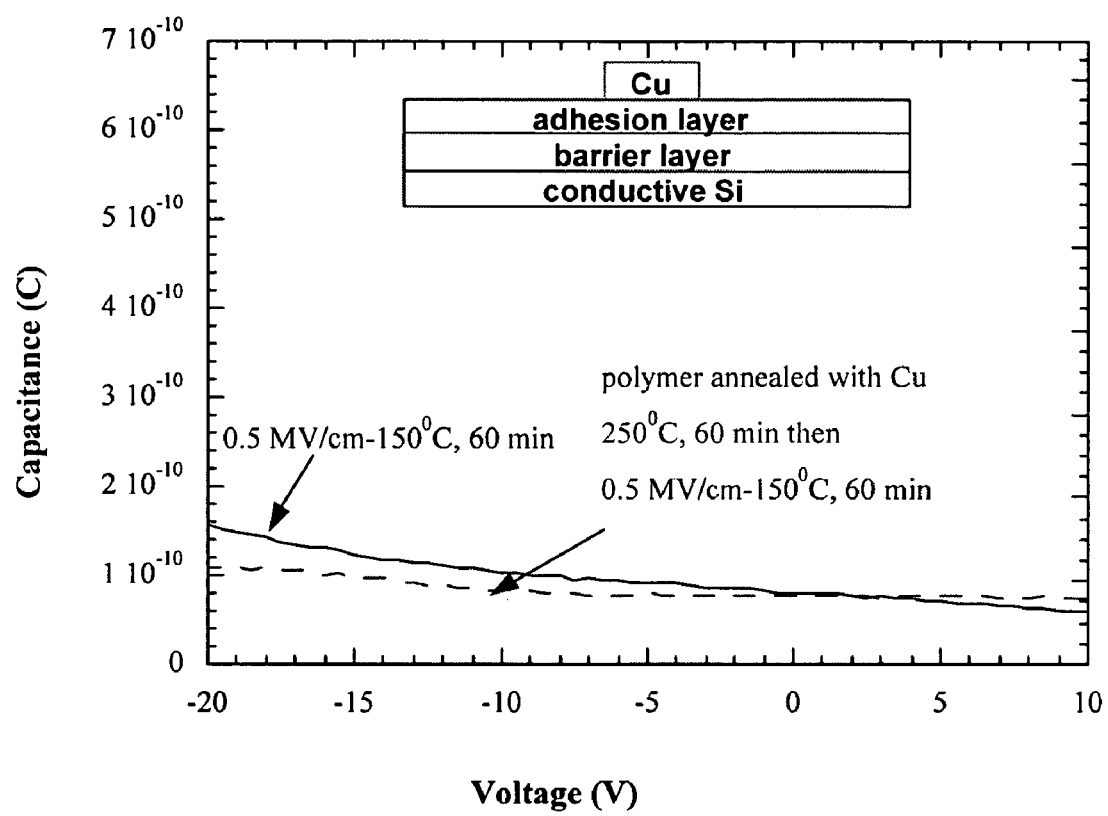
FIG. 4 is a graph of capacitance vs. voltage (C vs. V) representing the Triangular Voltage Sweep (TVS) data for as-deposited and for annealed (250° C.) Si/polymer dielectric/adhesion promoter/Cu samples, which shows that no Cu diffusion into the polymeric dielectric was observed in either case.

The Triangular Voltage Sweep (TVS) data were recorded for the samples of Examples 3 and 4 (including an adhesion promoter) and are presented in FIG. 4, which is a graph of capacitance vs. voltage (C vs. V). The data for the annealed structures of Example 4 are represented as dashed lines, and the data for the structures of Example 3 (no final anneal) are represented by a solid line. Cu diffusion into the siloxane epoxy polymer dielectric was not observed in either case, as indicated by the absence of a peak in the TVS curve at the BTS. Thus, good adhesion and metal diffusion barrier properties were achieved.

Figure 5:
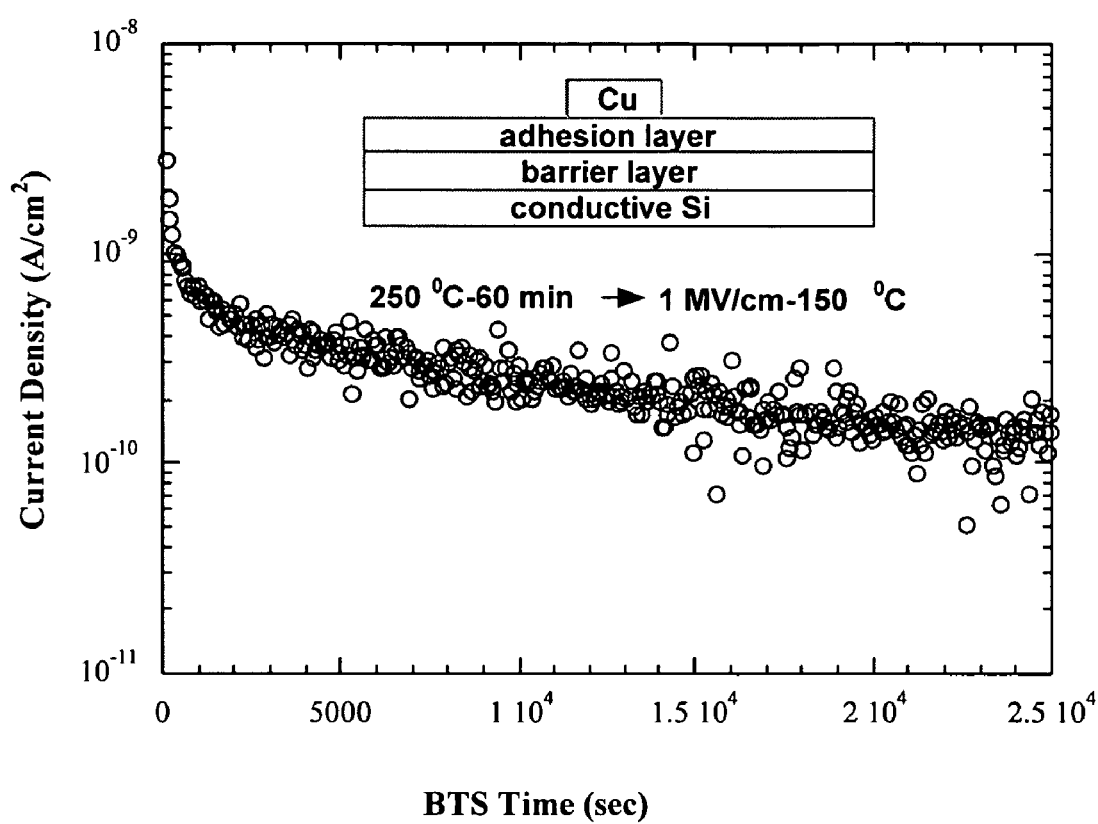
FIG. 5 is a graph of current density vs. time (I vs. t) for annealed (250° C.) Si/polymer dielectric/adhesion promoter/Cu samples, which indicates that the leakage current property does not degrade with time.

FIG. 5 is a graph of current density vs. time (I vs. t) for the annealed samples of Example 4 having an adhesion promoter included in the structures. As indicated in the graph, the current densities for the samples are lower than $1\times10^{-9}$ A/cm² at 1 MV/cm and 150° C. for at least up to 7 hrs. Again this shows that the leakage current property does not degrade with time. Thus, the samples with adhesion promoter provide adhesion and resist Cu charge injection.

The embodiment described in Example 4 is clearly advantageous because the siloxane epoxy polymer (adhesion promoter), when dried, cured, and annealed with the adjacent surface of the copper metal, promotes interaction with the metal to assure the adhesion. Furthermore, the electromigration of the metal is surprisingly reduced or eliminated altogether. Another advantage afforded by this embodiment is that the diffusion barrier property that prevents the penetration of metal into the layer of the siloxane epoxy polymer adjacent the adhesion promoter is completely assured.

Each of the patents and patent applications mentioned herein is hereby incorporated by reference in its entirety.

The invention has been described in detail with particular reference to preferred embodiments thereof, but it will be understood by those skilled in the art that variations and modifications can be effected within the spirit and scope of the invention.

We claim:

1. A structure comprising
   a. a conductive layer comprising a conductive metal;
   b. a diffusion barrier disposed onto a surface of said conductive layer, wherein said diffusion barrier comprises a first layer and a second layer, wherein said first layer is adjacent to said second layer and to said surface of said conductive layer, and wherein said first layer and said second layer are each independently selected from the group of siloxane epoxy polymers.

2. The structure of claim 1, wherein said first layer is an adhesion promoter having a thickness ranging from about 0.001 µm to about 3 µm.

3. The structure of claim 1, wherein said first layer is an adhesion promoter having a thickness ranging from about 0.01 µm to about 0.03 µm.

4. The structure of claim 1, wherein said second layer has a thickness ranging from about 0.02 µm to about 10 µm.

5. The structure of claim 1, wherein said second layer has a thickness ranging from about 0.02 µm to about 0.05 µm.

6. The structure of claim 1, wherein said conductive metal is selected from the group consisting of aluminum, aluminum alloys, tungsten, cobalt, metal silicides, copper, and copper alloys.

7. The structure of claim 6, wherein said conductive metal is copper or a copper alloy.

8. The structure of claim 1, wherein said group of siloxane epoxy polymers consists of polymers having formulae (I) and (II)

(I)

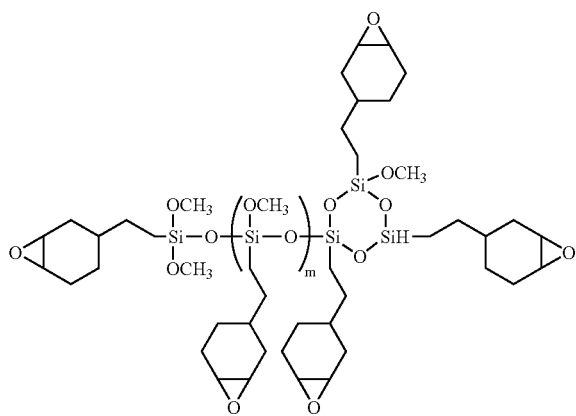

wherein m is an integer from 5 to 50;

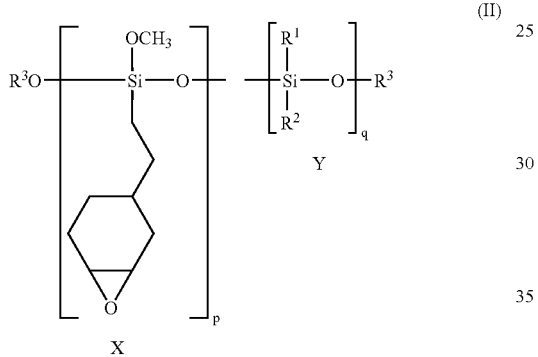

(II)

wherein X and Y are monomer units randomly distributed or occurring together, $R^1$ and $R^2$ are each independently selected from the group of methyl, methoxy, ethyl, ethoxy, propyl, butyl, pentyl, octyl, and phenyl; $R^3$ is methyl or ethyl; p is an integer ranging from 2 to 50; and q is 0 or an integer ranging from 1 to 50.

9. The structure of claim 8, wherein said first layer of said diffusion barrier is a siloxane epoxy polymer having formula (II), wherein $R^3$ is methyl.

10. The structure of claim 9, wherein $R^1$ and $R^2$ are both methyl groups in formula (II), and the ratio of p to q ranges from about 8:1 to about 1:1.

11. The structure of claim 10, wherein the ratio of p to q ranges from about 4:1 to about 2:1.

12. The structure of claim 8, wherein said second layer of said diffusion barrier is a siloxane epoxy polymer having formula (II), wherein $R^3$ is methyl.

13. The structure of claim 12, wherein $R^1$ and $R^2$ are both methyl groups in formula (II), and the ratio of p to q ranges from about 8:1 to about 1:1.

14. The structure of claim 13, wherein the ratio of p to q ranges from 4:1 to about 2:1.

15. The structure of claim 8, wherein said first layer of said diffusion barrier is a siloxane epoxy polymer having formula (I).

16. The structure of claim 8, wherein said second layer of said diffusion barrier is a siloxane epoxy polymer having formula (I).

17. The structure of claim 8, wherein a cationic polymerization initiator independently selected from the group consisting of diazonium, sulfonium, phosphonium, and iodonium salts is present with each said siloxane epoxy polymer of said first layer and said second layer of said diffusion barrier.

18. The structure of claim 17, wherein each said cationic polymerization initiator is an iodonium salt independently selected from the group consisting of diaryliodonium salts having formulae (III), (IV), (V), (VI), and (VII)

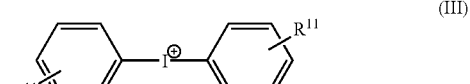

(III)

(IV)

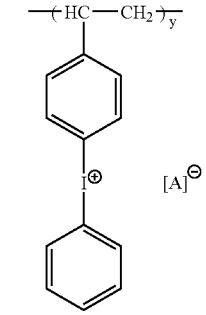

(V)

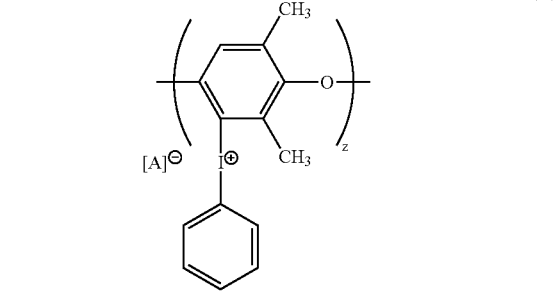

(VI)

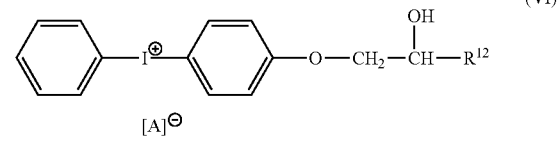

(VII)

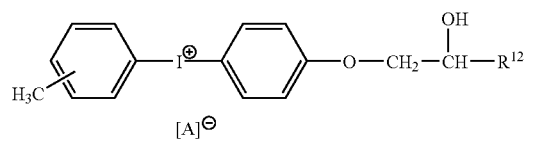

wherein each $R^{11}$ is independently hydrogen, $C_1$ to $C_{20}$ alkyl, $C_1$ to $C_{20}$ alkoxyl, $C_1$ to $C_{20}$ hydroxyalkoxyl, halogen, and nitro; $R^{12}$ is $C_1$ to $C_{30}$ alkyl or $C_1$ to $C_{30}$ cycloalkyl; y and z are each independently integers having a value of at least 5; and $[A]^-$ is a non-nucleophilic anion selected from the group consisting of $[BF_4]^-$, $[PF_6]^-$, $[AsF_6]^-$, $[SbF_6]^-$, $[B(C_6F_5)_4]^-$, and $[Ga(C_6F_5)_4]^-$.

19. The structure of claim 18, wherein each said selected cationic polymerization initiator is present in a catalyst solution comprising from about 20 to about 60 parts by weight of each said selected cationic polymerization initiator and from about 40 to about 80 parts by weight of 3,4-epoxycyclohexylmethyl-3',4'-epoxycyclohexane carboxylate, dicyclopentadiene dioxide, or bis(3,4-epoxycyclohexyl) adipate.

20. The structure of claim 1, further comprising a dielectric material disposed on an exposed surface of said diffusion barrier.

21. The structure of claim 20, wherein said dielectric material is selected from the group consisting of polyimides, parylene (poly-p-xylylene), polynaphthalene, benzocyclobutane (BCB), silicon-containing organic polymers, aromatic hydrocarbon polymers, and siloxane epoxy polymers.

* * * * *